United States Patent [19]

Toya et al.

[11] Patent Number: 4,937,698
[45] Date of Patent: Jun. 26, 1990

[54] SYSTEM FOR FORESEEING DETERIORATION IN INTERRUPTING PERFORMANCE OF VACUUM INTERRUPTER

[75] Inventors: Hideaki Toya; Tatsuya Hayashi, both of Hyogo, Japan

[73] Assignee: Mitsubishi Denki Kabushiki Kaisha, Tokyo, Japan

[21] Appl. No.: 267,269

[22] Filed: Nov. 4, 1988

[30] Foreign Application Priority Data

Nov. 6, 1987 [JP] Japan .................. 62-280589

[51] Int. Cl.⁵ .......................... H07H 3/14
[52] U.S. Cl. ............................ 361/86; 361/2; 200/144 B
[58] Field of Search ................... 361/1, 2, 86; 200/144 R, 144 B

[56] References Cited

U.S. PATENT DOCUMENTS

| | | | |
|---|---|---|---|
| 4,471,309 | 9/1984 | Lange et al. | 361/2 X |
| 4,578,730 | 3/1986 | Takuyama et al. | 200/144 B X |
| 4,791,518 | 12/1988 | Fischer | 361/2 |
| 4,797,522 | 1/1989 | Voshell | 200/144 B |

FOREIGN PATENT DOCUMENTS 126270 11/1984 European Pat. Off. ............ 361/2
61-263015 11/1986 Japan .

*Primary Examiner*—Derek S. Jennings
*Attorney, Agent, or Firm*—Bernard, Rothwell & Brown

[57] ABSTRACT

A system for foreseeing deterioration in interrupting a performance of a vacuum interrupter, including a first measuring component for measuring potentials of electric lines connected to fixed and movable electrodes of the vacuum interrupter; a second measuring component for measuring a potential of an arc shield; a signal transmitting section for the transmission of potential signals resulting from the measurements in the first and second measuring component; a comparing section for making a comparison between the measured signal from the first measuring component and the measured signal from the second measuring component both transmitted through the signal transmitting section; and a judging section for judging that the fixed and movable electrodes have been deteriorated in their interrupting performance, on the basis of the result of the comparison made in the comparing section.

4 Claims, 2 Drawing Sheets

SYSTEM FOR FORESEEING DETERIORATION IN INTERRUPTING PERFORMANCE OF VACUUM INTERRUPTER

BACKGROUND OF THE INVENTION

1. Field of the Invention

The present invention relates to a system for foreseeing deterioration in the interrupting performance of a vacuum interrupter which open and closes electric lines of an electric power system and more particularly to a system for foreseeing deterioration in interrupting performance by measuring a potential difference between a system potential member and an arc shield.

2. Description of the Prior Art

Vacuum interrupters generally do not require maintenance on inspection and have a long service life electrically and mechanically. However, there is a possibility of their being deteriorated in interrupting performance and no longer functioning as an interrupter due to abrasion of electrode contacts or lowering in the degree of vacuum of a vacuum switch tube (current breaking portion) with increase in the number of times of interruption. Therefore, a vacuum interrupter is required to be inspected periodically for its interrupting performance throughout its service life. It has been desired to develop a system capable of accurately foreseeing deterioration in the interrupting performance of a vacuum interrupter in a charged condition.

Heretofore, as a system for foreseeing deterioration in interrupting performance of a vacuum interrupter, there has been known a system which detects lowering in the degree of vacuum of a vacuum switch tube. FIG. 1 is a circuit diagram of a conventional system for detecting a reduction in the degree of vacuum of a vacuum switch tube set forth, for example, in Japanese Patent Laid-Open No. 263015/86. In the figure, numeral 11 denotes a vacuum interrupter having a metallic arc shield 16 insulated from a fixed electrode 12 and a movable electrode 13.

The system for detecting reduction in the degree of vacuum of the vacuum interrupter is provided with a first detector 18 constituted by a series circuit of impedance elements $Z_1$ and $Z_2$ as a voltage divider for detecting the waveform of a voltage $E_1$ to ground of the fixed electrode 12; a second detector 17 constituted by a series circuit of capacitors $C_1$ and $C_2$ as a voltage divider for detecting the waveform of a voltage $E_3$ to ground of the shield 16; a digital or analog phase shift detecting circuit 19 for detecting that a change in phase shift of the waveform of a detected voltage $e_3$ detected by the second detector 17 has become a value above a predetermined angle, using the waveform of a detected voltage $e_1$ detected by the first detector 18 as a comparison reference input; a memory circuit 20 for storing the detected output of the detecting circuit 19; and an alarm 21 for issuing a vacuum lowering alarm simultaneously with the storage operation of the memory circuit 20.

Operation will now be described.

As long as the fixed electrode 12 is in a charged condition, regardless of whether the fixed electrode 12 and the movable electrode 13 are in an open or closed state, there appears a voltage $E_3$ to ground on the shield 16 and there is obtained a waveform of detected voltage $e_3$ in the detector 17 together with a waveform of detected voltage $e_1$ in the detector 18. These waveforms of detected voltages $e_1$, $e_3$ of the detectors 18 and 17 are analogous to the voltage waveform of the system line and vary at the same rate with variation of line voltage and the occurrence of heavy high-frequency noise.

Thus, a detected voltage $e_1$ is used as a reference in judging reduction in the degree of vacuum from a change in the detected waveform provided by the detecting circuit 19, whereby there is effected detection without being influenced by voltage variation and noise.

The detecting circuit 19 makes judgment on the basis of an amount of change in phase shift between detected voltages $e_1$ and $e_3$ and thereby detects lowering in the degree of vacuum before the lowering progresses up to a degree of making the interrupter inoperative.

Then, the detector output from the detecting circuit 19 is stored in the memory circuit 20, whereby the detected signal indicative of the lowering in the degree of vacuum is maintained to let the alarm 21 continue its warning operation even when the degree of vacuum of the vacuum interrupter lowers rapidly to the level of atmospheric pressure.

Since the conventional system for foreseeing deterioration in interrupting performance of a vacuum interrupter is constructed as above, it inevitably relies on a vacuum lowering detector which detects lowering in the degree of vacuum of the interior of the vacuum switch. Thus, the deterioration of interrupting performance can be detected only in an indirect manner; in other words, the detection is inaccurate. This problem has been involved in the conventional system.

SUMMARY OF THE INVENTION

The present invention has been accomplished to solve the above-mentioned problem. It is the object thereof to provide a system for foreseeing deterioration in interrupting performance of a vacuum interrupter capable of detecting such deterioration directly and capable of foreseeing it accurately.

The system for foreseeing deterioration in interrupting performance of a vacuum interrupter according to the present invention is provided with a measuring section for measuring the potential of an arc shield and the potentials of fixed and movable electrode rods; a transmitting section for transmitting electrical signals resulting from the measurement in the measuring portion, in an electrically insulated manner; a comparing section for comparing the potentials of the fixed and movable electrode rods with the potential of the arc shield; and a judging section for judging that the interrupting performance has deteriorated, on the basis of the results of the comparison in the comparing portion.

In the system of the invention for foreseeing deterioration in interrupting performance of a vacuum interrupter, the arc shield and the fixed electrode rod or the movable electrode rod are detected to be almost equal in ground potential during arcing between the electrodes, to thereby foresee deterioration in interrupting performance.

DETAILED DESCRIPTION OF THE PREFERRED EMBODIMENT

An embodiment of the present invention will be described below with reference to the drawings.

Figure 1:
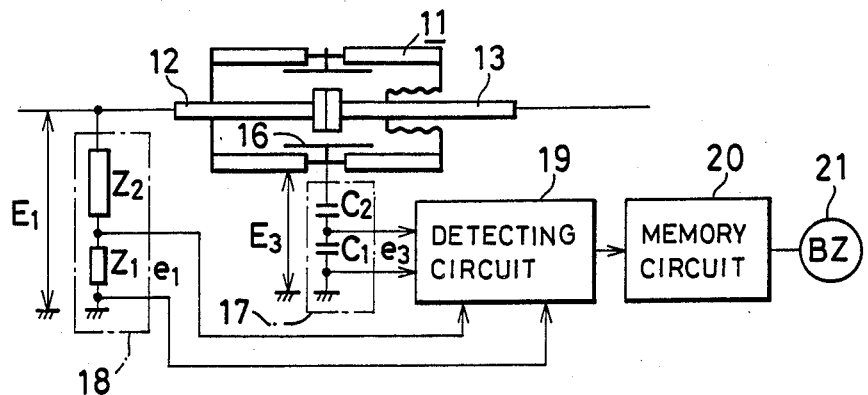
FIG. 1 is a circuit diagram of a conventional system for detecting lowering in the degree of vacuum of a vacuum interrupter.
Figure 2:
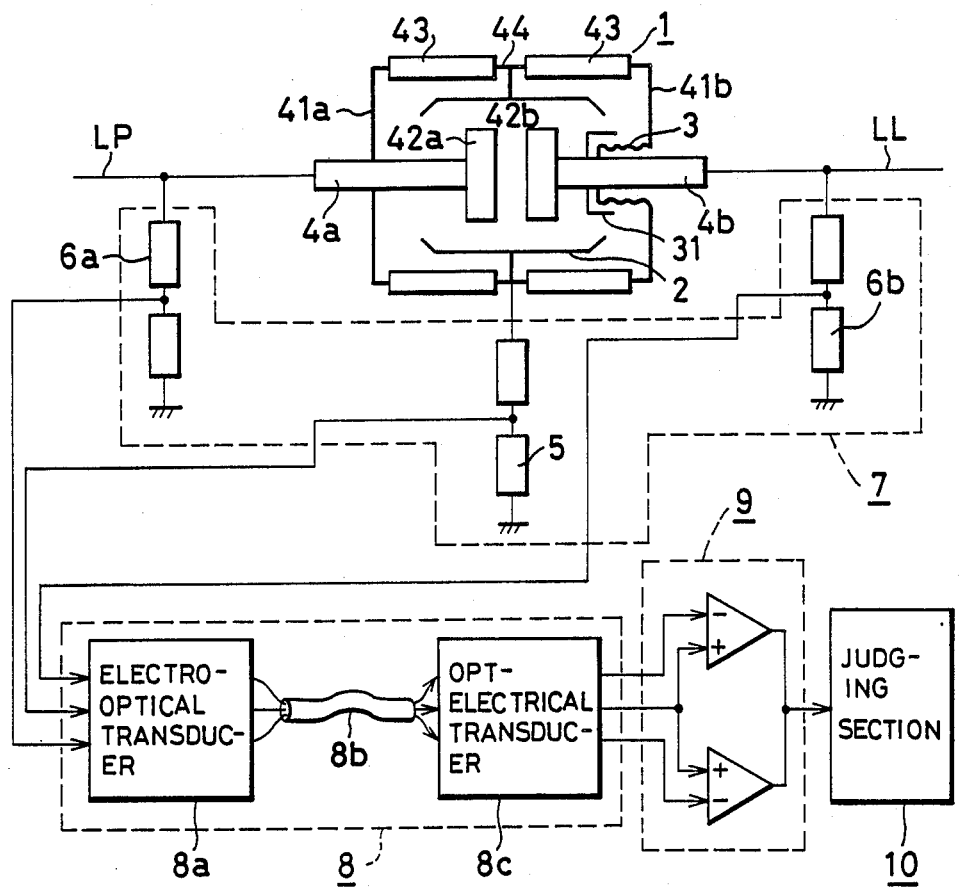
FIG. 2 is a circuit diagram of a system for foreseeing deterioration in interrupting performance of a vacuum interrupter according to an embodiment of the present invention.

In FIG. 2, numeral 1 denotes a vacuum switch tube; numeral 2 denotes an arc shield provided within the vacuum switch tube 1; numeral 3 denotes a bellows; numeral 31 denotes a bellows cover; and numeral 4a denotes a fixed electrode rod which supports a fixed electrode 42a and which is connected to a power source-side electric line LP, the fixed electrode rod 4a being fixed to an end plate 41a. Numeral 4b denotes a movable electrode rod which supports a movable electrode 42b and which is connected to a load-side electric line LL, the movable electrode rod 4b being fixed to an end plate 41b through the bellows 3 to move the movable electrode 42b into and out of contact with the fixed electrode 42a. The components represented by the reference numeral 43 are a pair of insulating cylinders coupled together in an air-tight manner through a metallic flange 44, the insulating cylinders 43 being connected to the end plates 41a and 41b, respectively, to form a vacuum vessel.

Numeral 7 denotes a measuring section composed of impedance voltage dividers 5, 6a and 6b for measuring the potentials of the arc shield 2 and of the fixed and movable electrode rods 4a, 4b.

Numeral 8 denotes a signal transmitting section composed of an electro-optical transducer 8a, an optical fiber 8b and an opto-electrical transducer 8c. The signal transmitting section 8 transmits potential signals resulting from the measurement in the impedance voltage divider 5 (constituting a second measuring portion) and like dividers 6a and 6b (constituting a first measuring portion), to a comparing section 9 in an electrically insulated manner. Numeral 10 denotes a judging section for judging that the vacuum interrupter has deteriorated in its interrupting performance.

The operation of the system embodying the invention will now be described. Having made studies about the correlation between the interrupting performance of a vacuum interrupter and the potentials of an arc shield and electrode rods, the present inventors found out experimentally that with deterioration of the interrupting performance, the potential of the arc shield 2 and either the potential of the fixed electrode rod 4a or that of the movable electrode rod 4b (depending on the flowing direction of interrupting current) became almost equal to each other, that is, the potential difference became almost zero.

In view of such phenomenon, during arcing between the fixed electrode 42a and the movable electrode 42b due to deterioration of the interrupting performance, if the arc shield 2 as well as the fixed and movable electrode rods 4a, 4b are measured for ground potential by the impedance voltage dividers 5, 6a and 6b, respectively, in the measuring section 7 and the thus-measured potential signals are transmitted from the measuring section 7 to the comparing section 9 through the signal transmitting section 8 and then compared in the comparing section 9, the potential difference between the arc shield 2 and the fixed electrode rod 4a and that between the arc shield 2 and the movable electrode rod 4b become almost equal and the result of the comparison in the comparing section 9, namely, the potential difference, becomes almost zero, so on the basis of this result of comparison it is possible to detect deterioration of the interrupting performance in the judging section 10.

Figure 3:
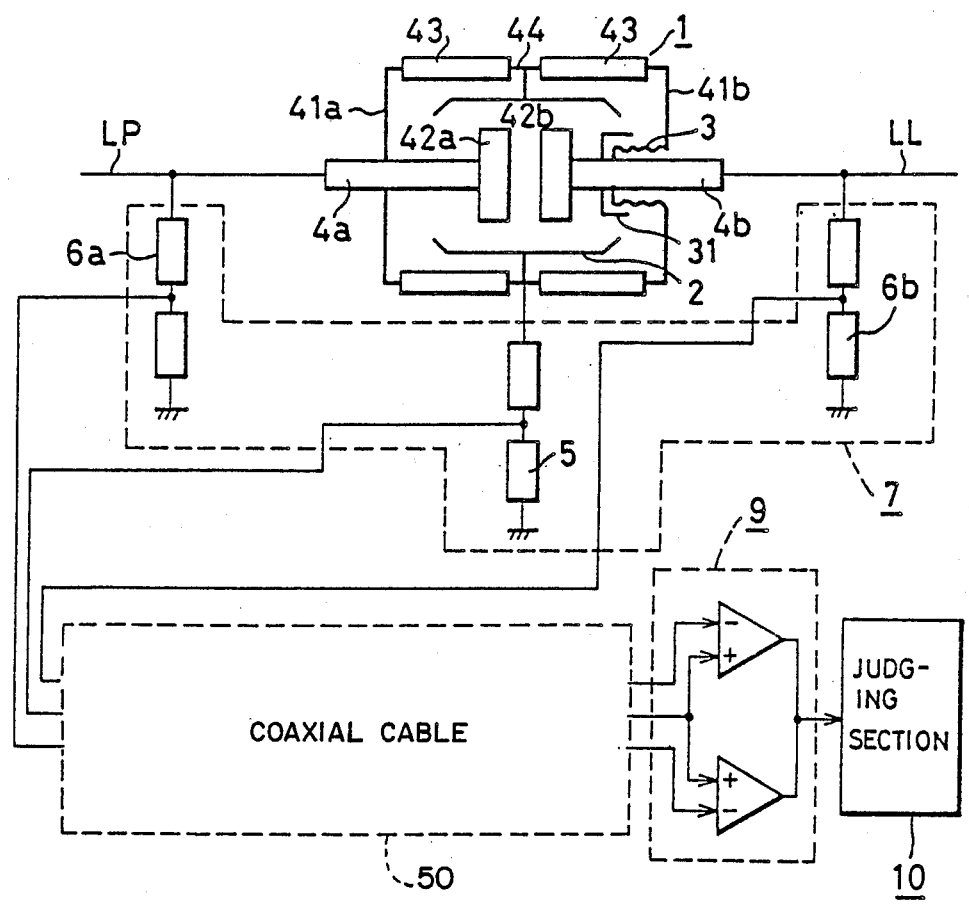
FIG. 3 is a modification of the embodiment of FIG. 2.

Although in the above embodiment the potential signal transmitting section 8 is composed of an electro-optical transducer 8a, optical fiber 8b and opto-electrical transducer 8c in order to effect electrical insulation, it may be constituted using an ordinary coaxial cable as represented by block 50 in FIG. 3 in the case where the system potential is not so high to the extent of requiring insulation.

Further, although the above embodiment describes a vacuum interrupter, a vacuum contactor may be equally included in the concept of such vacuum interrupter and even in this case there will be attained the same effect as in the above embodiment.

According to the construction of the present invention, as set forth hereinabove, the deterioration in interrupting performance is detected directly utilizing the phenomenon that the arc shield and the fixed or movable electrode rod become almost equal in potential during arcing between the electrodes due to the deterioration in interrupting performance, whereby it is possible to foresee the deterioration in interrupting performance accurately.

What is claimed is:

1. A system for foreseeing deterioration in interrupting performance of a vacuum interrupter having a fixed electrode, a movable electrode capable of making and breaking contact with said fixed electrode, and an arc shield insulated from said fixed and movable electrodes, comprising:
    first measuring means for measuring potentials of electric lines connected to said fixed and movable electrodes;
    second measuring means for measuring a potential of said arc shield;
    signal transmitting means for transmitting potential signals developed from the measurements of said first and second measuring means;
    comparing means coupled to said signal transmitting means for determining the difference between the potential signal of said first measuring means and the potential signal of said second measuring means, so as to determine the difference between the potential of one of said fixed and movable electrodes and the potential of said arc shield; and
    judging means for judging that said fixed and movable electrodes have deteriorated in interrupting performance when said difference has become almost zero.

2. A system for foreseeing deterioration in interrupting performance of the vacuum interrupter as set forth in claim 1, wherein said signal transmitting section is composed of an electro-optical transducer, an optical fiber and an opto-electrical transducer.

3. A system for foreseeing deterioration in interrupting performance of the vacuum interrupter as set forth in claim 1, wherein said signal transmitting section is constituted by a coaxial cable.

4. A system for foreseeing deterioration in interrupting performance of a vacuum interrupter having a fixed electrode, a movable electrode capable of making and breaking contact with said fixed electrode, and an arc shield insulated from said fixed and movable electrodes, comprising:
    first measuring means for measuring potentials of electric lines connected to said fixed and movable electrodes;

second measuring means for measuring a potential of said arc shield;
signal transmitting means for transmitting potential signals developed from the measurement of said first and second measuring means, said signal transmitting means including an electro-optical transducer, an optical fiber and an opto-electrical transducer;
comparing means coupled to said signal transmitting means for determining the difference between the potential signal of said first measuring means and the potential signal of said second measuring means, so as to determine the difference between the potential of one of said fixed and movable electrodes and the potential of said arc shield; and
judging means for judging that said fixed and movable electrodes have deteriorated in interrupting performance when said difference has become almost zero.

* * * * *

UNITED STATES PATENT AND TRADEMARK OFFICE
CERTIFICATE OF CORRECTION

PATENT NO. : 4,937,698

DATED : June 26, 1990

INVENTOR(S) : Hideaki Toya et al.

It is certified that error appears in the above-identified patent and that said Letters Patent is hereby corrected as shown below:

Column 5, line 4, "measurement" should be --measurements--.

Signed and Sealed this

Twenty-fourth Day of September, 1991

Attest:

HARRY F. MANBECK, JR.

Attesting Officer

Commissioner of Patents and Trademarks